United States Patent
Noh et al.

(10) Patent No.: US 8,017,295 B2
(45) Date of Patent: *Sep. 13, 2011

(54) LASER INDUCED THERMAL IMAGING APPARATUS AND LASER INDUCED THERMAL IMAGING METHOD AND ORGANIC LIGHT EMITTING DISPLAY DEVICE USING THE SAME

(75) Inventors: Sok Won Noh, Yongin (KR); Mu Hyun Kim, Yongin (KR); Sun Hoe Kim, Yongin (KR); Myung Won Song, Yongin (KR); Jin Wook Seong, Yongin (KR); Seong Taek Lee, Yongin (KR); Sang Bong Lee, Yongin (KR)

(73) Assignee: Samsung Mobile Display Co., Ltd., Yongin (KR)

(*) Notice: Subject to any disclaimer, the term of this patent is extended or adjusted under 35 U.S.C. 154(b) by 1416 days.

This patent is subject to a terminal disclaimer.

(21) Appl. No.: 11/512,570

(22) Filed: Aug. 28, 2006

(65) Prior Publication Data

US 2007/0103540 A1    May 10, 2007

(30) Foreign Application Priority Data

Nov. 4, 2005   (KR) .................. 10-2005-0105696
Nov. 16, 2005  (KR) .................. 10-2005-0109823

(51) Int. Cl.
   *G03C 8/00*   (2006.01)
   *H01L 21/00*  (2006.01)
   *H01L 51/40*  (2006.01)
   *G21K 5/10*   (2006.01)

(52) U.S. Cl. .............. 430/200; 438/29; 438/34; 438/99; 250/492.22

(58) Field of Classification Search .............. 250/492.22
See application file for complete search history.

(56) References Cited

U.S. PATENT DOCUMENTS 3,927,943 A    12/1975  Pohl et al.
(Continued)

FOREIGN PATENT DOCUMENTS

CN    1591108 A    3/2005
(Continued)

OTHER PUBLICATIONS

Taiwanese Office action dated Mar. 29, 2010, for corresponding Taiwanese Patent application 09920191480, with English translation, noting listed references in this IDS.

(Continued)

*Primary Examiner* — Matthew Luu
*Assistant Examiner* — Kendrick Liu
(74) *Attorney, Agent, or Firm* — Christie, Parker & Hale, LLP

(57) ABSTRACT

A laser induced thermal imaging (LITI) apparatus, an LITI method, and an organic light emitting display (OLED) device. An LITI apparatus for forming a light emitting layer of an OLED device includes a substrate stage adapted to receive an accepter substrate and a donor film to be laminated, the accepter substrate having a pixel area of the OLED device and a magnet, the donor film having the light emitting layer transferred to the pixel area; a laser oscillator for radiating a laser to the donor film; a contact frame adapted to be placed between the substrate stage and the laser oscillator, the contact frame having at least one transmission portion corresponding to the light emitting layer transferred to the acceptor substrate and having a magnet for forming a magnetic force with the accepter substrate; and a contact frame transferring mechanism for moving the contact frame toward the substrate stage.

15 Claims, 5 Drawing Sheets

U.S. PATENT DOCUMENTS

| | | | |
|---|---|---|---|
| 4,377,339 A | 3/1983 | Coppock | |
| 4,500,803 A | 2/1985 | Hayes | |
| 4,975,637 A | 12/1990 | Frankeny et al. | |
| 5,182,003 A | 1/1993 | Maass et al. | |
| 5,725,979 A | 3/1998 | Julich | |
| 5,937,272 A | 8/1999 | Tang | |
| 6,270,934 B1 | 8/2001 | Chang et al. | |
| 6,509,142 B2 | 1/2003 | Baxter et al. | |
| 6,649,286 B2 | 11/2003 | Kim et al. | |
| 6,666,541 B2 | 12/2003 | Ellson et al. | |
| 6,688,365 B2 | 2/2004 | Tyan et al. | |
| 6,695,029 B2 | 2/2004 | Phillips et al. | |
| 6,939,649 B2 | 9/2005 | Hotta et al. | |
| 7,217,334 B2 | 5/2007 | Toyoda | |
| 7,233,101 B2 | 6/2007 | Jin | |
| 7,396,631 B2 | 7/2008 | Wright et al. | |
| 7,502,043 B2 * | 3/2009 | Noh et al. | 347/171 |
| 2002/0030440 A1 | 3/2002 | Yamazaki | |
| 2003/0042849 A1 * | 3/2003 | Ogino | 313/504 |
| 2003/0207500 A1 * | 11/2003 | Pichler et al. | 438/127 |
| 2005/0007442 A1 | 1/2005 | Kay et al. | |
| 2005/0048295 A1 | 3/2005 | Kim et al. | |
| 2005/0087289 A1 * | 4/2005 | Toyoda | 156/230 |
| 2005/0133802 A1 | 6/2005 | Lee et al. | |
| 2005/0153472 A1 | 7/2005 | Yotsuya | |
| 2005/0181587 A1 | 8/2005 | Duan et al. | |
| 2006/0011136 A1 * | 1/2006 | Yamazaki et al. | 118/719 |
| 2006/0063096 A1 | 3/2006 | Lee et al. | |
| 2007/0006807 A1 | 1/2007 | Manz | |
| 2007/0009671 A1 | 1/2007 | Manz | |
| 2007/0046770 A1 * | 3/2007 | Noh et al. | 347/238 |
| 2007/0048893 A1 * | 3/2007 | Noh et al. | 438/82 |
| 2007/0103920 A1 * | 5/2007 | Noh et al. | 362/458 |

FOREIGN PATENT DOCUMENTS

| | | |
|---|---|---|
| CN | 1636760 A | 7/2005 |
| CN | 1638543 A | 7/2005 |
| EP | 0 749 847 A1 | 12/1996 |
| EP | 0 790 138 A1 | 8/1997 |
| JP | 61-273968 | 12/1986 |
| JP | 05-138959 | 6/1993 |
| JP | 08-123000 | 5/1996 |
| JP | 09-155720 | 6/1997 |
| JP | 09-167684 | 6/1997 |
| JP | 10-039791 | 2/1998 |
| JP | 10-41069 | 2/1998 |
| JP | 10-055888 | 2/1998 |
| JP | 11-54275 | 2/1999 |
| JP | 11-054275 | 2/1999 |
| JP | 11-158605 | 6/1999 |
| JP | 2000-96211 | 4/2000 |
| JP | 2002-075636 | 3/2002 |
| JP | 2002-198174 | 7/2002 |
| JP | 2002-260921 | 9/2002 |
| JP | 2003-76297 | 3/2003 |
| JP | 2003-077658 | 3/2003 |
| JP | 2003-187972 | 4/2003 |
| JP | 2003-187973 | 7/2003 |
| JP | 2003-197372 | 7/2003 |
| JP | 2004-079540 | 3/2004 |
| JP | 2004-87143 | 3/2004 |
| JP | 2004-296224 | 10/2004 |
| JP | 2004-355949 | 12/2004 |
| JP | 2005-005245 | 1/2005 |
| JP | 2005-85799 | 3/2005 |
| JP | 2005-183381 | 7/2005 |
| TW | 369483 | 9/1999 |
| TW | 418336 | 1/2001 |

OTHER PUBLICATIONS

Patent Abstracts of Japan for Publication No. 2004-296224; Date of publication of application Oct. 21, 2004, in the name of Hidefumi Odaka et al.

Patent Abstract of Japan for Publication No. 2004-355949; Date of publication of application Dec. 16, 2004 in the name Akira Ebisawa et al.

Patent Abstracts of Japan, and English machine translation of Japanese Publication 2003-197372 listed above, 45 pages.

U.S. Office action dated Feb. 8, 2008, for cross-reference U.S. Appl. No. 11/512,991.

U.S. Office action dated Nov. 28, 2008, for cross-reference U.S. Appl. No. 11/512,991.

U.S. Office action dated May 18, 2009, for cross-reference U.S. Appl. No. 11/507,792.

U.S. Office action dated Jun. 18, 2009, for related U.S. Appl. No. 11/510,372.

U.S. Office action dated May 21, 2009, for related U.S. Appl. No. 11/509,463.

U.S. Office action dated Aug. 20, 2008, for cross-reference U.S. Appl. No. 11/509,463.

U.S. Office action dated Sep. 19, 2008, for cross-reference U.S. Appl. No. 11/508,159 (now issued as U.S. Patent 7,502,043).

Response to U.S. Office action dated Sep. 19, 2008, for cross-reference U.S. Appl. No. 11/508,159 (now issued as U.S. Patent 7,502,043).

U.S. Office action dated Mar. 8, 2010, for related U.S. Appl. No. 11/507,792.

SIPO Office action dated Nov. 7, 2008, for Chinese application 2006101369376, w/ English translation of text.

SIPO Office action dated May 9, 2008, with English translation, for Chinese Patent application 200610142214.8.

Japanese Office action dated Mar. 24, 2009, for related Japanese application 2006-061367.

Japanese Office action dated May 12, 2009, for Japanese Patent application 2006-080211.

Japanese Office action dated Jun. 2, 2009, for Japanese Patent application 2006-234478.

Japanese Office action dated Aug. 25, 2009, for Japanese Patent application 2006-061329.

Japanese Office action dated Jul. 13, 2010, for Japanese Patent application 2006-234478.

Lee, Seong Taek et al., 21.3: *A New Patterning Method for Full-Color Polymer Light-Emitting Devices: Laser Induced Thermal Imaging (LITI)*; SID 02 Digest, 4pp.

Lee, Seong Taek et al., 29.3: *A Novel Patterning Method for Full-Color Organic Light-Emitting Devices: Laser Induced Thermal Imaging (LITI)*; SID 00 Digest, 4pp.

Niko et al., *"White light and RGB electroluminescence by light color-conversion"*, 1998, Materials Physics and Devices for Molecular Electronics and Photonics, vol. 9 iss. 1-4, pp. 188-191.

Taiwanese Office action dated Jul. 28, 2008, for Taiwanese Patent application 095131694.

Taiwan Office action dated Jul. 28, 2008, for Taiwanese Patent application 095131945.

* cited by examiner

LASER INDUCED THERMAL IMAGING APPARATUS AND LASER INDUCED THERMAL IMAGING METHOD AND ORGANIC LIGHT EMITTING DISPLAY DEVICE USING THE SAME

CROSS-REFERENCE TO RELATED APPLICATIONS

This application claims priority to and the benefit of Korean Patent Application No. 10-2005-0109823 filed on Nov. 16, 2005, and Korean Patent Application No. 10-2005-0105696 filed on Nov. 4, 2005, in the Korean Intellectual Property Office, the entire contents of both of which are incorporated herein by reference.

BACKGROUND

1. Field of the Invention

The present invention relates to a laser induced thermal imaging (LITI) apparatus and a laser induced thermal imaging method, and an organic light emitting display device using the same, and more particularly, to a laser induced thermal imaging apparatus and a laser induced thermal imaging method, and an organic light emitting display device for performing a process of laminating a donor film and an accepter substrate using a magnetic force.

2. Discussion of Related Art

An organic light emitting device includes a light emitting layer formed between first and second electrodes and emits light when a voltage is applied between the electrodes. Hereinafter, prior art and embodiments of the present invention will be described in reference to the laser induced thermal imaging apparatus used for fabricating an organic light emitting device, but the present invention is not limed thereto.

A laser induced thermal imaging method radiates a laser on a donor substrate including a base substrate, a light-to-heat conversion layer and a transfer layer (or imaging layer), and converts the laser that passes through the base substrate into heat in the light-to-heat conversion layer, such that the light-to-heat conversion layer is deformed and expanded. This way, the transfer layer is adhered to the acceptor substrate, such that the transfer layer can be transferred to the acceptor substrate.

When performing the laser induced thermal imaging method, the inside of a chamber in which the transfer is performed should be in a vacuum state. However, in the prior art, there is a problem that the imaging layer is not transferred well because a space or impurities are created between the donor substrate and the accepter substrate when a laser-to-heat conversion is performed in the vacuum state. Therefore, in the laser induced thermal imaging method, the method of laminating the donor and accepter substrates is important, and to address the problems that arise during lamination, various methods have been investigated.

FIG. 1 is a partial cross-sectional view of a laser induced thermal imaging apparatus according to prior art for resolving the above-mentioned problems. According to FIG. 1, a laser induced thermal imaging apparatus 10 includes a substrate stage 12 placed in a chamber 11 and a laser oscillator 13 placed at an upper portion of the chamber 11. The substrate stage 12 is a stage for supporting an accepter substrate 14 and a donor film 15 introduced into the chamber 11.

For laminating the accepter substrate 14 and the donor film 15 without space or impurities between them, when the accepter substrate 14 and the donor film 15 are adhered with each other in the chamber 11 in which the laser-to-heat conversion is performed, the chamber 11 is not maintained in vacuum but particles or impurities in the chamber 11 are absorbed by a vacuum pump P.

However, in this prior art, it is difficult to absolutely prevent creating impurities 1 and the space between the accepter substrate 14 and the donor film 15 and maintain a vacuum state in the chamber 11. It is well known in the art that reliability and durability of products are adversely affected when the space and/or the impurities are present between the acceptor substrate and the donor film.

SUMMARY OF THE INVENTION

Accordingly, it is an aspect of the present invention to provide a laser induced thermal imaging apparatus and a laser induced thermal imaging method, and an organic light emitting display device using the same that can strongly laminate and closely adhere to each other a donor film and an accepter substrate using a magnetic force.

One embodiment of the present invention provides a laser induced thermal imaging apparatus for forming a light emitting layer of an organic light emitting display device that includes: a substrate stage adapted to receive an accepter substrate and a donor film to be laminated, the accepter substrate having a pixel area of the organic light emitting display device and a magnet, the donor film having the light emitting layer to be induced to the pixel area, a laser oscillator for radiating a laser to the donor film, a contact frame adapted to be placed between the substrate stage and the laser oscillator, the contact frame having a magnet, and a contact frame transferring mechanism for moving the contact frame toward the substrate stage.

Another embodiment of the present invention provides a laser induced thermal imaging apparatus for forming a light emitting layer of an organic light emitting display device that includes: a substrate stage adapted to receive an accepter substrate and a donor film to be laminated, the accepter substrate having a pixel area of the organic light emitting display device and a magnet, the donor film having the light emitting layer to be transferred to the pixel area, a laser oscillator for radiating a laser to the donor film, a contact frame adapted to be placed between the substrate stage and the laser oscillator, the contact frame having at least one transmission portion made of a transparent material for allowing a laser to pass through, and having a magnet for forming a magnetic force together with the accepter substrate, and a contact frame transferring mechanism for moving the contact frame toward the substrate stage.

Another embodiment of the present invention provides a laser induced thermal imaging apparatus for forming a light emitting layer of an organic light emitting display device that includes: a substrate stage adapted to receive an accepter substrate and a donor film to be laminated, the accepter substrate having a pixel area of the organic light emitting display device and a magnetic substance, the donor film having the light emitting layer to be transferred to the pixel area, a laser oscillator for radiating a laser to the donor film, a contact frame adapted to be placed between the substrate stage and the laser oscillator, the contact frame having at least one transmission portion made of a transparent material for allowing a laser to pass through, and having a magnet for forming a magnetic force together with the accepter substrate, and a contact frame transferring mechanism for moving the contact frame toward the substrate stage.

Another embodiment of the present invention provides a laser induced thermal imaging apparatus for forming a light emitting layer of an organic light emitting display device that includes: a substrate stage adapted to receive an accepter substrate and a donor film to be laminated, the accepter substrate having a pixel area of the organic light emitting display device and a magnet, the donor film having the light emitting layer to be transferred to the pixel area, a laser oscillator for radiating a laser to the donor film, a contact frame adapted to be placed between the substrate stage and the laser oscillator, the contact frame having at least one transmission portion made of a transparent material for allowing a laser to pass through, and having a magnetic substance for forming a magnetic force together with the accepter substrate, and a contact frame transferring mechanism for moving the contact frame toward the substrate stage.

Another embodiment of the present invention provides a laser induced thermal imaging method for forming a light emitting layer of an organic light emitting display device. The method includes: transferring a donor film and laminating the donor film and an acceptor substrate between a contact frame having a magnet and a substrate stage, the donor film including a light emitting layer, the accepter substrate having a pixel area of the organic light emitting display device and a magnet, the light emitting layer being adapted to be transferred to the pixel area, adhering the accepter substrate and the donor film using a magnetic force formed between the accepter substrate and the contact frame, and radiating a laser on the donor film to allow the light emitting layer of the donor film to be transferred to the accepter substrate.

Another embodiment of the present invention provides an organic light emitting display device including: an accepter substrate having at least one surface on which a magnet is located, a buffer layer located on the accepter substrate, a first electrode layer located on the buffer layer, a pixel definition film having an opening through which at least one region of the first electrode layer is exposed, a light emitting layer located on the first electrode layer and the pixel definition film by a laser induced thermal imaging method, and a second electrode layer located on the light emitting layer and the pixel definition film.

BRIEF DESCRIPTION OF THE DRAWINGS

These and/or other aspects and features of the invention will become apparent and more readily appreciated from the following description of the exemplary embodiments, taken in conjunction with the accompanying drawings of which.

DETAILED DESCRIPTION

Figure 1:
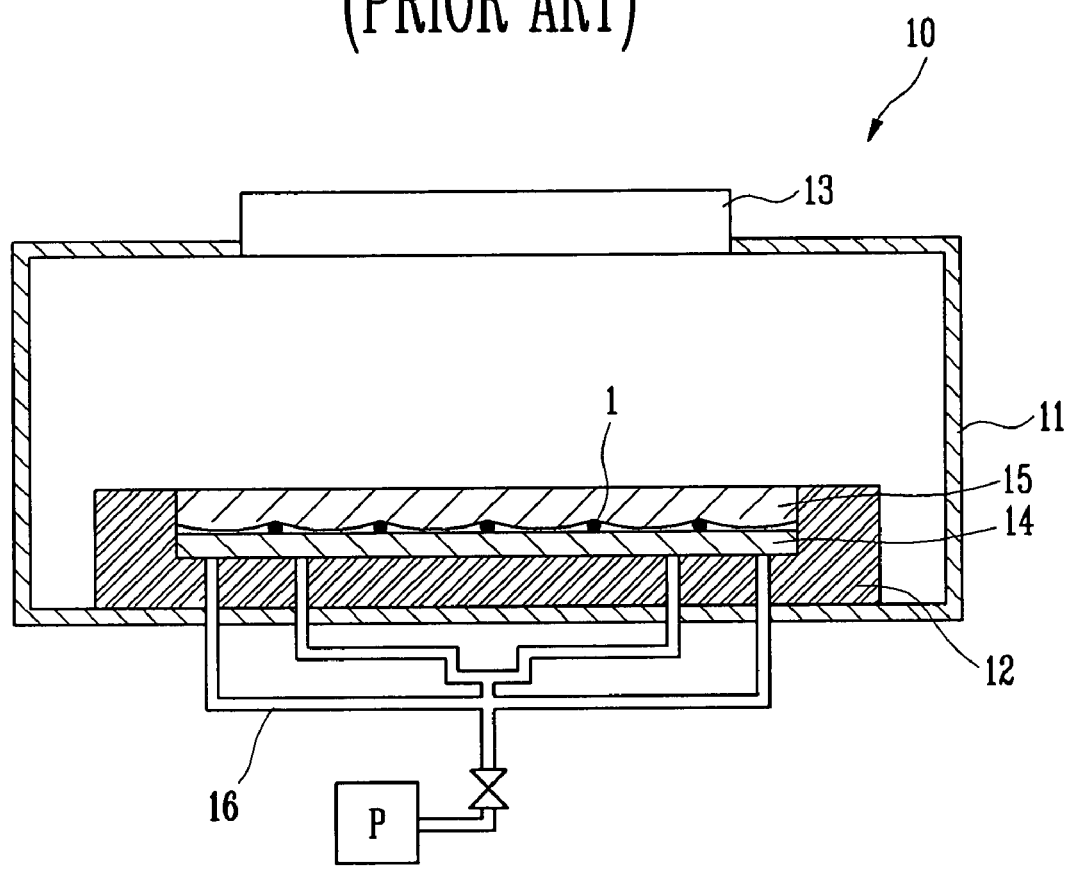
FIG. 1 is a cross-sectional view showing a laser induced thermal imaging apparatus according to prior art.

Hereinafter, certain exemplary embodiments according to the present invention will be described with reference to the accompanying drawings. In this application, when one element is described as being connected to another element, the one element may be either directly connected to said another element, or may be indirectly connected to said another element via a third element. Further, some of the elements that are not essential to the complete understanding of the invention have been omitted for clarity. Also, like reference numerals refer to like elements throughout.

Figure 2:
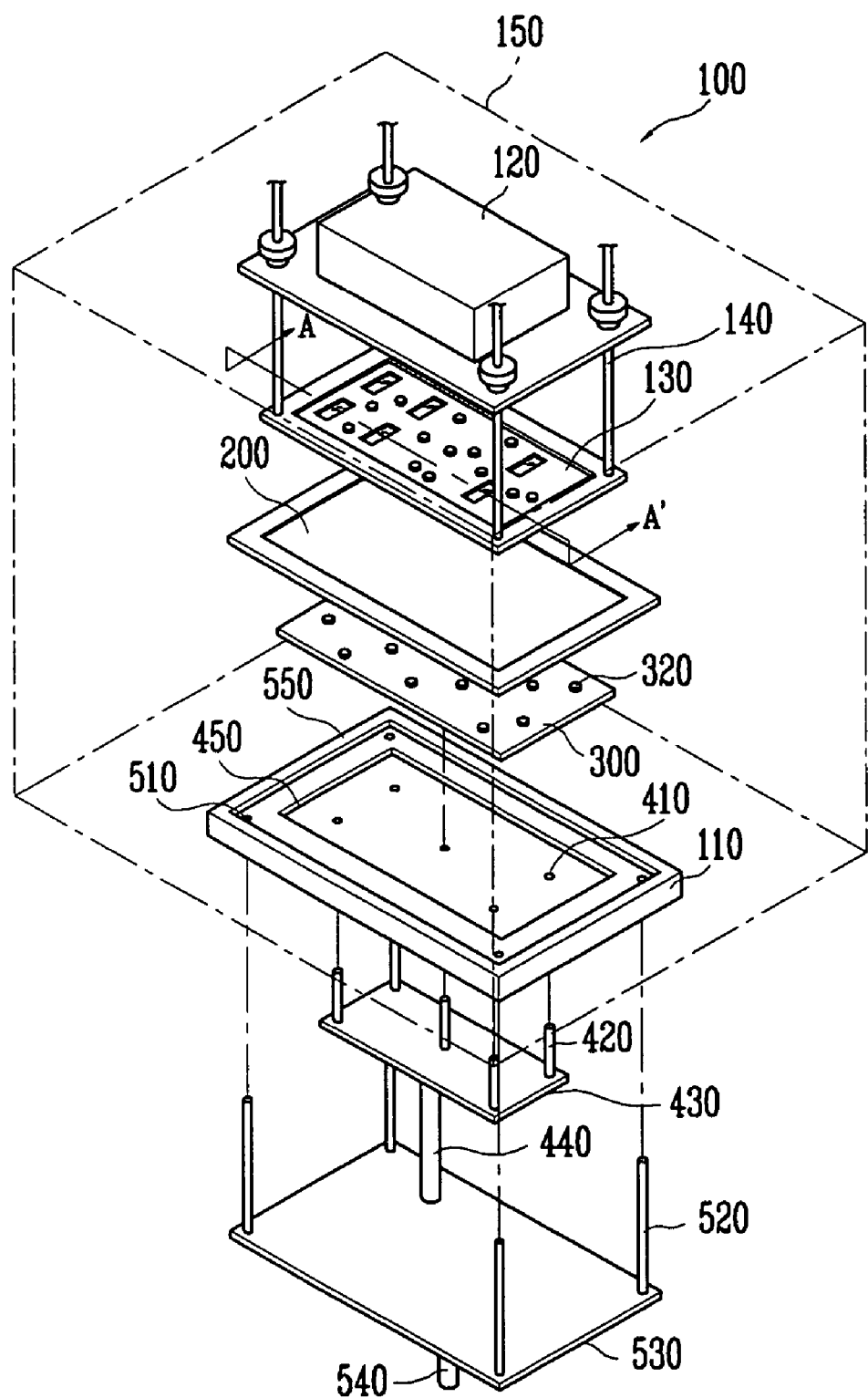
FIG. 2 is an exploded perspective view showing a laser induced thermal imaging apparatus according to one embodiment of the present invention.

FIG. 2 is an exploded perspective view showing a laser induced thermal imaging apparatus according to first through fourth embodiments of the present invention. According to FIG. 2, a laser induced thermal imaging apparatus 100 includes a substrate stage 110, a laser oscillator 120, a contact frame 130, a contact frame transferring mechanism 140, and a chamber 150.

First Embodiment

In the first embodiment, a contact process (or adhering process) of a donor film 200 and an accepter substrate 300 using a magnetic force between an accepter substrate 300 having a magnet and the contact frame 130 having openings of a predetermined pattern and a magnet is described. First, the chamber 150 may be a chamber used in a conventional laser induced thermal imaging apparatus. At least the substrate stage 110 and the contact frame 130 are installed or placed in the chamber 150. The donor film 200 and the accepter substrate 300 are transferred or moved into the chamber 150. A transferring mechanism (not shown) is used for transferring the donor film 200 and the accepter substrate 300 from an exterior of the chamber 150 into the chamber 150. Though it is desirable when considering a manufacturing process of an organic light emitting diode that the inner space of the chamber 150 is maintained in vacuum, the present invention is not limited thereto.

The substrate stage 110 may be considered as a type of table on which the accepter substrate 300 and the donor film 200 are laminated. The accepter substrate 300 has a pixel definition area (or pixel area) of an organic light emitting device and includes a magnet. The magnet generates a magnetic force together with the contact frame 130 described below. In the described embodiment, the magnet may be an electromagnet or a permanent magnet.

A magnet may be installed or implemented on the accepter substrate 300 by using various methods. In one embodiment, the magnet may be formed on an upper surface or a lower surface of the accepter substrate 300.

Figure 3A:
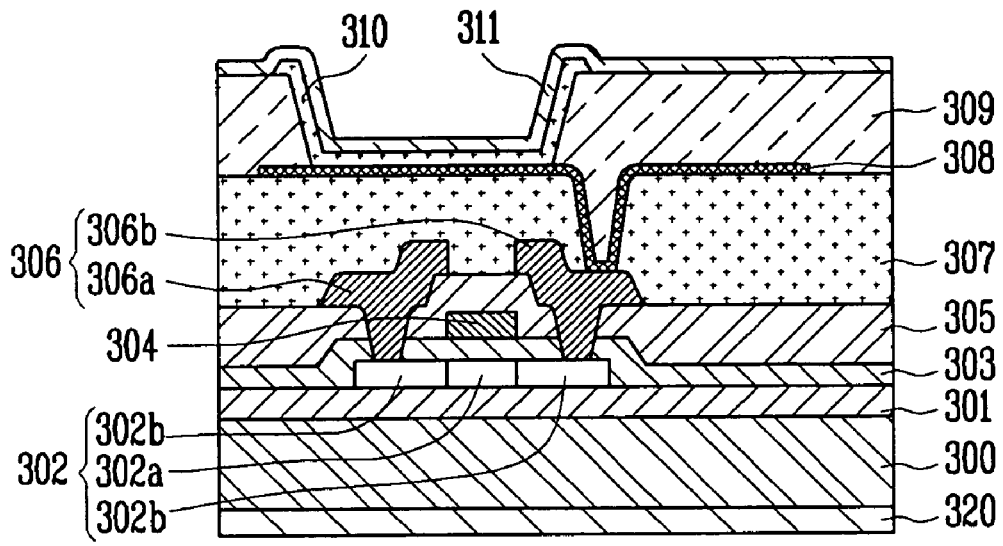
FIG. 3A and FIG. 3B are cross-sectional views showing examples of organic light emitting diodes fabricated on an acceptor substrate in a laser induced thermal imaging apparatus according to an embodiment of the present invention.
Figure 3B:
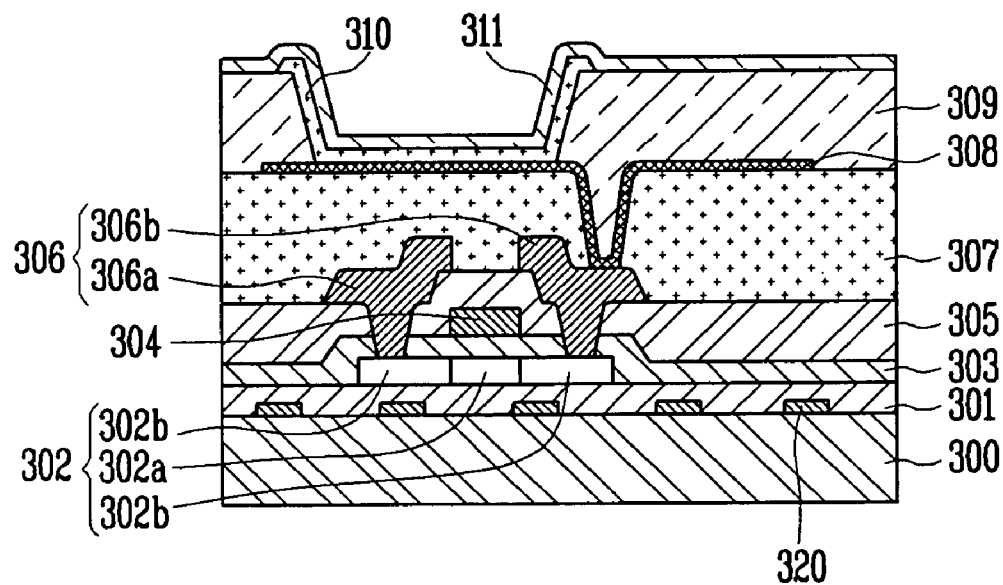

FIG. 3A is a cross-sectional view of an organic light emitting diode formed on the accepter substrate 300 having at least one magnet 320. FIG. 3B is a cross-sectional view of another organic light emitting diode formed on the acceptor substrate 300, which is substantially the same as that of FIG. 3A except for the location of magnets 320'. The organic light emitting diode according to the described embodiments of the present invention includes a buffer layer 301 (or 301'), a semiconductor layer 302, a gate insulating layer 303, a gate electrode 304, a layer-to-layer insulating layer 305, source and drain electrodes 306 (a source electrode 306a and a drain electrode 306*b*), and a planarization layer 307 which are formed on the accepter substrate 300.

The buffer layer 301 (or 301') is first formed on the accepter substrate 300 and a semiconductor layer 302 including an active layer 302*a* (e.g., a gate) and an ohmic contact layer 302*b* is formed on a portion of the buffer layer 301 (or 301'). As shown in FIG. 3A, the at least one magnet 320 is formed on a lower surface of the accepter substrate 300, and as shown in FIG. 3B, the magnets 320' are formed between the acceptor substrate 300 and a buffer layer 301'. The magnets 320 or 320' may be an electromagnet or a permanent magnet, and may be placed in a plane. In one embodiment, the magnets 320 or 320' include the plurality of magnets 320 or 320' which substantially have a shape of concentric circles or plural lines in widthwise and lengthwise directions.

The gate insulating layer 303 is formed on the semiconductor layer 302 and the buffer layer 301 (or 301'), and the gate 304 electrode, the width of which corresponds to that of the active layer 302*a*, is formed on an area of the gate insulating layer 303.

The layer-to-layer insulating layer 305 is formed on the gate electrode 304 and the gate insulating layer 303, and the source and drain electrodes 306*a* and 306*b* are formed on respective areas (e.g., predetermined areas) of the layer-to-layer insulating layer 305.

The source and drain electrodes 306*a* and 306*b* contact with respective exposed areas (i.e., source and drain regions) of the ohmic contact layer 302*b*, and the planarization layer 307 is formed on the source and drain electrodes 306*a* and 306*b* and the layer-to-layer insulating layer 305.

The first electrode 308 is formed on an area of the planarization layer 307, and contacts with an exposed area of either the source electrode 306*a* or the drain electrode 306*b*.

The pixel definition film 309, which has an opening for exposing at least one area of the first electrode 308, is formed on the first electrode 308 and the planarization layer 307.

The light emitting layer 310 is formed on the opening of the pixel definition film 309, and the second electrode 311 is formed on the light emitting layer 310 and the pixel definition film 309.

Returning now to FIG. 2, the substrate stage 110 further includes a driving mechanism (not shown) for moving the substrate stage 110. When the substrate stage 110 moves, the laser oscillator 120 may radiate the laser in one direction. For example, when the laser is radiated in a lengthwise direction and a driving mechanism for moving the substrate stage 110 in the widthwise direction is included, the laser may be radiated on the whole surface of the donor film 200.

Further, the substrate stage 110 may include an installing mechanism for receiving and installing the accepter substrate 300 and the donor film 200. The installing mechanism makes it possible to allow the accepter substrate 300 and the donor film 200 which are transferred into the chamber 150 by the transferring mechanism to exactly arrange the accepter substrate 300 and the donor film 200 at a fixed place on the substrate stage 110.

In the described embodiment, the installing mechanism includes through holes 410 and 510, guide bars 420 and 520, supporters 440 and 540, and installing grooves 450 and 550. The guide bars 420 move upwardly and downwardly together with a transferring plate 430 and the supporter 440. When the guide bars 420 move up through the through holes 410, the accepter substrate 300 is received, and when the guide bars 420 move down, the accepter substrate 300 is installed into (or placed on) the installing groove 450 formed on the substrate stage 110. Because the installing mechanism would be known to and may be modified in various different manners by those skilled in the art, the detail of the installing mechanism is omitted for convenience of description.

Figure 4:
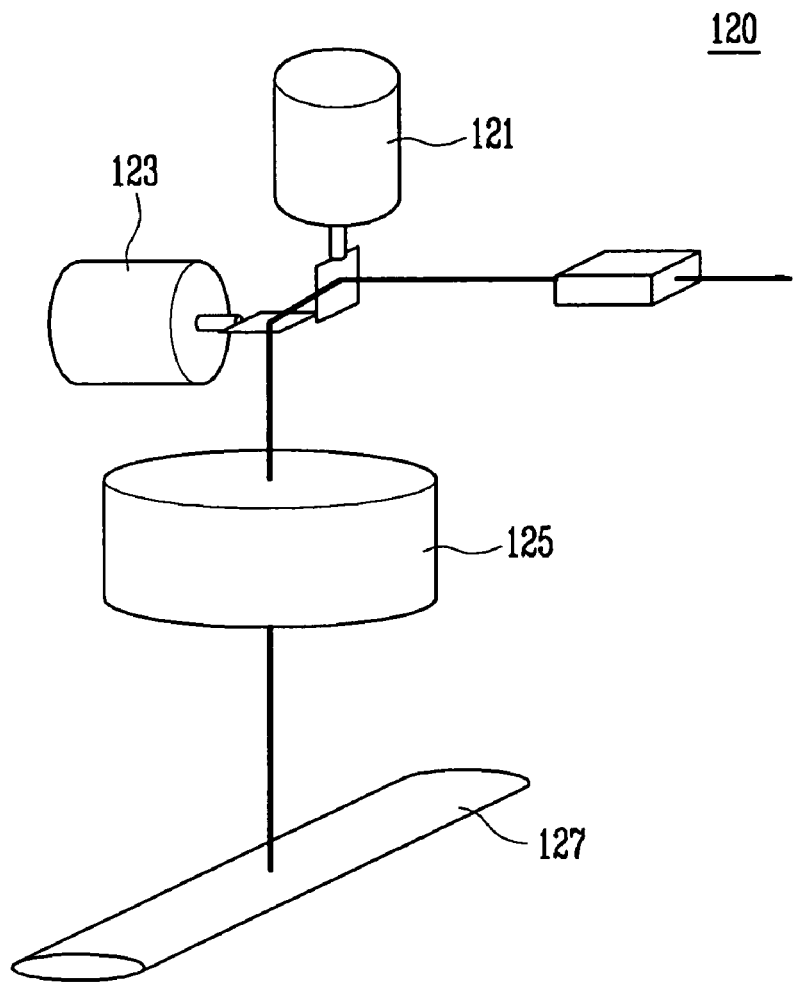
FIG. 4 is a view showing one example of a laser oscillator of a laser induced thermal imaging apparatus used in the present invention.

The laser oscillator 120 may be installed in or out of the chamber 150. In one embodiment, the laser oscillator 120 is installed to radiate the laser from an upper portion of the chamber 150. In FIG. 4, which is a schematic view of the laser oscillator 120, though the laser oscillator 120 according to the present invention uses a CW ND:YAG laser (1604 nm) and includes two galvanometer scanners 121 and 123, a scan lens 125, and a cylinder lens 127, the present invention is not limited thereto.

The contact frame 130 includes a magnet, and strongly laminates the donor film 200 and the accepter substrate 300 which are placed between the substrate stage 110 and the contact frame 130 by forming a magnetic force with the magnet of the acceptor substrate 300. In another embodiment, the contact frame 130 may be a magnet in itself. In the described embodiment, the magnet is formed on the upper surface or the lower surface of the contact frame 130.

The contact frame 130 has openings 133 (shown in FIG. 5) to allow the laser to pass therethrough, and functions as a mask to radiate the laser only on a portion (e.g., a predetermined portion) of the donor film 200. The openings 133 on the contact frame 130 may be openings covered with transparent material such as glass or transparent polymer.

The contact frame 130 can be exchanged with other contact frames having openings to form sub-pixels of an organic light emitting display device. Similarly, the donor film 200 can be exchanged with other donor films (e.g., donor films having different color emission layers) for transferring the emission layers that correspond to the contact frames.

Figure 6:
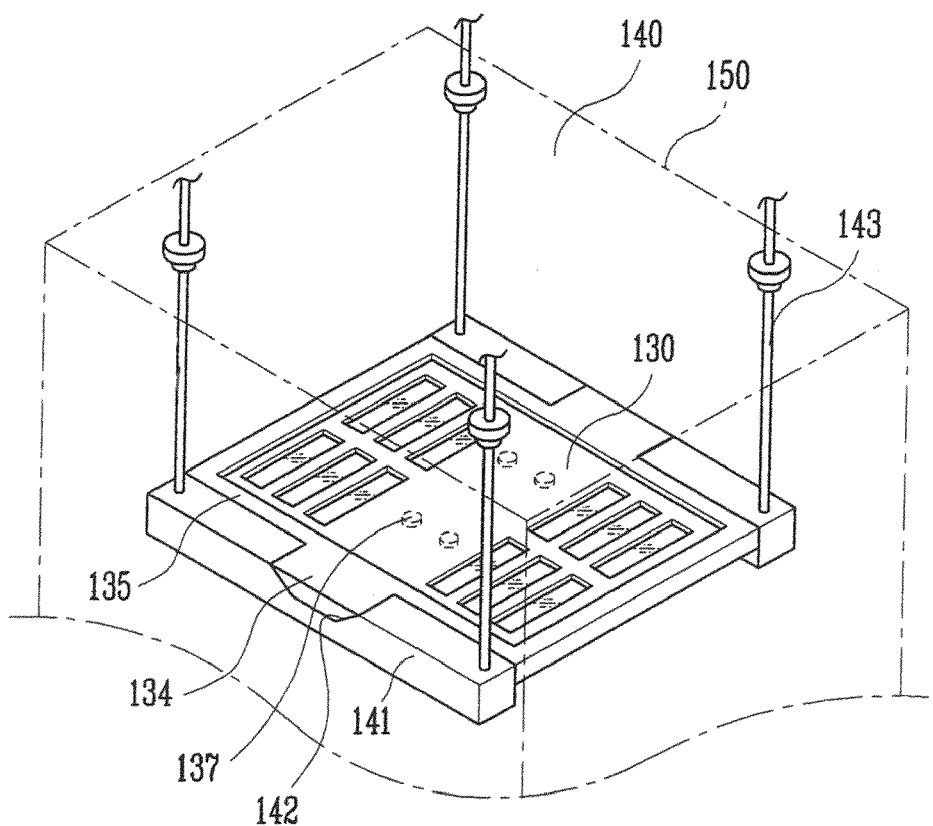
FIG. 6 is a perspective view showing a contact frame transferring mechanism of a laser induced thermal imaging apparatus according to an exemplary embodiment of the present invention.

The contact frame transferring mechanism 140 may variously be fabricated as a mechanism for moving the contact frame 130 to and from the substrate stage 100. According to the embodiment depicted in FIG. 6, the contact frame transferring mechanism 140 includes a holding board 141 having a holding groove 142, connecting bars 143 at or near the upper portion of the chamber 150 and connected to the holding board 141, and a driving mechanism for upwardly and downwardly driving the holding board 141 connected to the connecting bars 143. As shown in FIG. 6, when the contact frame 130 is transferred by the transferring mechanism 140, the contact frame 130 is installed in a tray 135 having a holding protrusion 134.

An exchanging mechanism, such as a robot arm, may be used for exchanging a first contract frame with a second contact frame. For example, after the first and second sub-pixels are formed using the first contact frame, the robot arm may transfer the first contact frame from the holding board to the outside of the chamber 150, and places the second contact frame at the holding board, such that the exchanging is performed.

Figure 7:
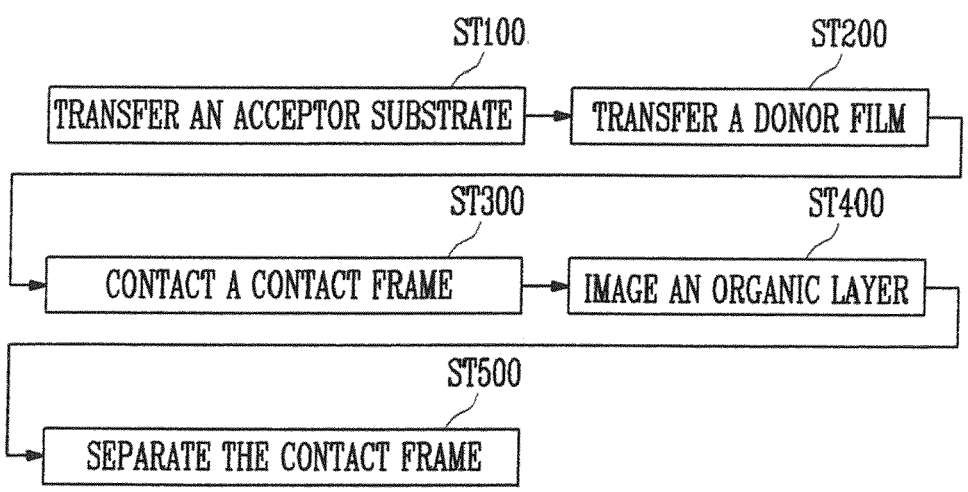
FIG. 7 is a flow diagram illustrating a laser induced thermal imaging method according to an exemplary embodiment the present invention.

Next, referring to FIG. 2 and FIG. 7, using the above-mentioned laser induced thermal imaging apparatus, a method of forming organic light emitting diodes will be described. For forming the organic light emitting diodes, the method of using the laser induced thermal imaging apparatus includes an accepter substrate transferring (or placing) step ST100, a donor film transferring (or placing) step ST200, a contact frame contacting (or adhering) step ST300, a sub-pixel transferring step (or organic layer imaging step) ST400, and a contact frame separating step ST500.

The accepter substrate transferring step ST100 places the accepter substrate 300 on the substrate stage 110. A pixel definition area (or pixel area) to which a light emitting layer is transferred from the donor film, is defined on the accepter substrate 300.

The donor film transferring step ST200 transfers the donor film having a light emitting layer to be transferred on the accepter substrate 300. At this time, the light emitting layer has one color, for example, red (R). The donor films can be replaced with other donor films having different colors (e.g., green (G) or blue (B)), for example, to transfer light emission layers having different colors to the acceptor substrate 300 to form different color sub-pixels.

In the contact frame contacting step ST300, the contact frame 130 including magnets 137 is moved toward the substrate stage and is contacted with the same, using a magnetic force. Therefore, the donor film and the accept substrate placed between the contact frame and the substrate stage are laminated. At this time, the contact frame is first contacted by allowing the transferring mechanism to transfer or move the contact frame toward the substrate stage. The contact frame is then more strongly contacted by using the magnetic force.

In the sub-pixel imaging step ST400, the laser is radiated through the openings of the contact frame on the donor film thereby to allow the organic light emitting layer included in the donor film to be expanded, such that the organic light emitting layer is transferred onto the pixel definition area of the accepter substrate. At this time, the radiation range of the laser is controlled to allow the pixel definition area of the transmission portion to be exposed.

In the contact frame separating step ST500, the contact frame is separated from the accepter substrate by using the contact frame transferring mechanism. In this embodiment, the contact frame is first separated from the accepter substrate by using a repulsive force, and then, the contact frame is upwardly transferred to an upper portion of the chamber by the contact frame transferring mechanism.

Although the present invention has mainly been shown and described in reference to the first embodiment, it would be appreciated by those skilled in the art that changes might be made in this embodiment without departing from the principles or spirit of the invention. For example, it would be appreciated by those skilled in the art that the construction of the transferring mechanism, the shape of the openings, the shape of magnets (e.g., using magnetic nano-particles) can be changed. The laser induced thermal imaging apparatuses and methods according to second, third and fourth embodiments are substantially the same as those described above in reference to the first embodiment, except for the structure of the acceptor substrate and/or the contact frame. Therefore, the description of some of the substantially same elements will be omitted for the sake of clarity and convenience.

Second Embodiment

The second embodiment of the present invention is directed to a contacting process of the donor film 200 and the accepter substrate 300 (e.g., see FIG. 2) by using a magnetic force between the accepter substrate having a magnet and the contact frame 130 having transmission (or transmitting) portions made of a transparent material and one or more magnets 137 (e.g., see FIG. 6).

The magnets 137 may be installed or placed on the accepter substrate 300 using various methods. In the simplest, the magnet is formed on a lower surface or an upper surface of the accepter substrate 300.

Referring back to FIGS. 3A and 3B, FIG. 3A and FIG. 3B are cross-sectional views respectively showing organic light emitting diodes formed on an accepter substrate 300 and having magnets 320 (or 320'). The organic light emitting diode according to the present invention includes a buffer layer 301 (or 301'), a semiconductor layer 302, a gate insulating layer 303, a gate electrode 304, a layer-to-layer insulating layer 305, a source electrode 306a, a drain electrode 306b, and a planarization layer 307 which are formed on the accepter substrate 300.

The buffer layer 301 is first formed on the accepter substrate 300 and a semiconductor layer 302 including an active layer 302a and an ohmic contact layer 302b is formed on a portion of the buffer layer 301 (or 301'). As shown in FIG. 3A, at least one magnet 320 is formed on a lower surface of the accepter substrate 300, and as shown in FIG. 3B, magnets 320 are formed between the acceptor substrate 300 and a buffer layer 301'. The magnets 320 or 320' may be an electromagnet or a permanent magnet, and may be placed in a plane. In the described embodiment, the magnets 320 or 320' include a plurality of magnets 320(or 320') which substantially have a shape of concentric circles or plural lines in widthwise and lengthwise directions.

The gate insulating layer 303 is formed on the semiconductor layer 302 and the buffer layer 301 (or 301'), and the gate electrode 304 the width of which corresponds to that of the active layer 302a, is formed on an area of the gate insulating layer 303.

The layer-to-layer insulating layer 305 is formed on the gate electrode 304 and the gate insulating layer 303, and the source and drain electrodes 306a and 306b are formed on respective areas of the layer-to-layer insulating layer 305.

The source and drain electrodes 306a and 306b respectively contact with exposed areas (i.e., source and drain regions) of the ohmic contact layer 302b, and the planarization layer 307 is formed on the source and drain electrodes 306a and 306b and the layer-to-layer insulating layer 305.

The first electrode 308 is formed on an area of the planarization layer 307, and contacts with an exposed area of either the source electrode 306a or the drain electrode 306b.

The pixel definition film 309, which has an opening for exposing at least one area of the first electrode 308, is formed on the first electrode 308 and the planarization layer 307.

The light emitting layer 310 is formed on the opening of the pixel definition film 309, and the second electrode 311 is formed on the light emitting layer 310 and the pixel definition film 309.

Figure 5:
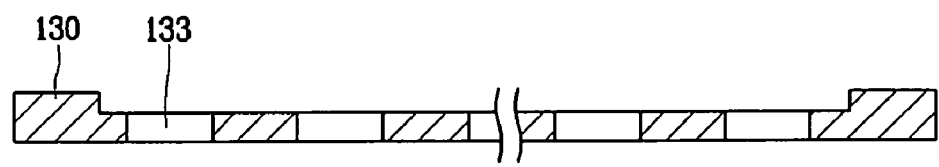
FIG. 5 is a schematic cross-sectional view of a contact frame of a laser induced thermal imaging apparatus taken along the line A-A' of FIG. 2.

The contact frame 130 has transmission portions 133 that allow the laser to pass through the transmission portions 133. FIG. 5 is a cross-sectional view taken along the line A-A' of FIG. 2 showing the transmission portions 133. Because of the transmission portions 133, the contact frame 130 functions as a mask to radiate the laser only on a portion of the donor film 200 (e.g., a predetermined portion). Though a material of the transmission portions 133 is not limited, the material of the transmission portions 133 may be a glass or a transparent polymer in one exemplary embodiment. Also, because the transmission portions 133 do not include any magnet, the area of the transmission portions 133 is limited to 1% through 50% of a total area of the contract frame 130 in one embodiment, such that the magnetic force of the contact frame 130 is maintained at a suitable level or an optimum level to laminate the donor film and the accepter substrate.

The contact frame 130 can be exchanged with other contact frames having transmission (or transmitting) portions to form sub-pixels of an organic light emitting device. Similarly, the donor film 200 can be exchanged with other donor films having different color emission layers, for example, to form different color sub-pixels.

Third Embodiment

The third embodiment of the present invention is directed to a contacting process of the donor film 200 and the accepter substrate 300 by using a magnetic force between the accepter substrate having a magnet and the contact frame having one or more transmission portions made of a transparent material and a magnet.

A magnetic substance may be installed on the accepter substrate 200 in various methods. In one embodiment, the magnetic substance is formed on a lower surface or an upper surface of the accepter substrate 300. The magnetic substance may include a ferromagnetic substance and/or an anti-ferromagnetic substance and may be made of one among Fe, Ni, Cr, $Fe_2O_3$, $Fe_3O_4$, $CoFe_2O_4$, and/or any combination thereof.

Referring back to FIGS. 3A and 3B, FIG. 3A and FIG. 3B are cross-sectional views respectively showing an accepter substrate 300 of an organic light emitting diode on which magnets are formed. The organic light emitting diode according to the present invention includes a buffer layer 301 (or 301'), a semiconductor layer 302, a gate insulating layer 303, a gate 304, a layer-to-layer insulating layer 305, a source electrode 306a, a drain electrode 306b, and a planarization layer 307 which are formed on the accepter substrate 300.

The buffer layer 301 is first formed on the accepter substrate 300 and a semiconductor layer 302 including an active layer 302a and an ohmic contact layer 302b is formed on a portion of the buffer layer 301 (or 301'). As shown in FIG. 3A, at least one magnet 320 is formed on a lower surface of the accepter substrate 300, and as shown in FIG. 3B, a magnetic substance 320' is formed between the acceptor substrate 300 and a buffer layer 301'.

The gate insulating layer 303 is formed on the semiconductor layer 302 and the buffer layer 301 (or 301'), and the gate 304 electrode, the width of which corresponds to that of the active layer 302a, is formed on an area of the gate insulating layer 303.

The layer-to-layer insulating layer 305 is formed on the gate electrode 304 and the gate insulating layer 303, and the source and drain electrodes 306a and 306b are formed on respective areas of the layer-to-layer insulating layer 305.

The source and drain electrodes 306a and 306b respectively contact with exposed areas (i.e., source and drain regions) of the ohmic contact layer 302b, and the planarization layer 307 is formed on the source and drain electrodes 306a and 306b and the layer-to-layer insulating layer 305.

The first electrode 308 is formed on an area of the planarization layer 307, and contacts with an exposed area of either the source electrode 306a or the drain electrode 306b.

The pixel definition film 309, which has an opening for exposing at least one area of the first electrode 308, is formed on the first electrode 308 and the planarization layer 307.

The light emitting layer 310 is formed on the opening of the pixel definition film 309, and the second electrode 311 is formed on the light emitting layer 310 and the pixel definition film 309.

The contact frame 130 has transmission portions 133 that allow the laser to pass through the transmission portions 133. FIG. 5 is a cross-sectional view taken along the line A-A' of FIG. 2 showing the transmission portions 133. Because of the transmission portions 133, the contact frame 130 functions as a mask to radiate the laser only on a portion (e.g., a predetermined portion) of the donor film 200. Though a material of the transmission portions 133 is not limited, the material of the transmission portions 133 may be a glass or a transparent polymer in one exemplary embodiment. Also, because the transmission portions 133 do not include any magnet, the area of the transmission portions 133 is limited to 1% through 50% of a total area of the contract frame 130, such that the magnetic force of the contact frame 130 is maintained at a suitable level or an optimum level to laminate the donor film and the accepter substrate.

The contact frame 130 can be exchanged with other contact frames having transmission (or transmitting) portions to form sub-pixels of an organic light emitting device. Similarly, the donor film 200 can be exchanged with other donor films having different color emission layers, for example, to form different color sub-pixels.

Fourth Embodiment

The fourth embodiment of the present invention is directed to a contacting process of the donor film 200 and the accepter substrate 300 by using the magnetic force between the accepter substrate having a magnet and the contact frame having a transmission portion made of a transparent material and a magnet.

A magnet may be installed on the accepter substrate 300 in various methods. In one embodiment, the magnet is formed on a lower surface or an upper surface of the accepter substrate 300. The magnet 320 may be an electromagnet or a permanent magnet, and may be placed in a plane. A plurality of magnets 320 may be used, which substantially have a shape of concentric circles or plural lines in widthwise and lengthwise directions.

Referring back to FIGS. 3A and 3B, FIG. 3A and FIG. 3B are cross-sectional views respectively showing an accepter substrate 300 of an organic light emitting diode on which magnets 320 or 320' are formed. The organic light emitting diode according to the present invention includes a buffer layer 301, a semiconductor layer 302, a gate insulating layer 303, a gate 304, a layer-to-layer insulating layer 305, a source electrode 306a, a drain electrode 306b, and a planarization layer 307 which are formed on the accepter substrate 300.

The buffer layer 301 is first formed on the accepter substrate 300 and a semiconductor layer 302 including an active layer 302a and an ohmic contact layer 302b is formed on a portion of the buffer layer 301 (or 301'). As shown in FIG. 3A, at least one magnet 320 is formed on a lower surface of the accepter substrate 300, and as shown in FIG. 3B, magnets 320' are formed between the acceptor substrate 300 and the buffer layer 301'.

The gate insulating layer 303 is formed on the semiconductor layer 302 and the buffer layer 301 (or 301'), and the gate electrode 304, the width of which corresponds to that of the active layer 302a, is formed on an area of the gate insulating layer 303.

The layer-to-layer insulating layer 305 is formed on the gate electrode 304 and the gate insulating layer 303, and the source and drain electrodes 306a and 306b are formed on respective areas of the layer-to-layer insulating layer 305.

The source and drain electrodes 306a and 306b respectively contact with exposed areas (i.e., source and drain regions) of the ohmic contact layer 302b, and the planarization layer 307 is formed on the source and drain electrodes 306a and 306b and the layer-to-layer insulating layer 305.

The first electrode 308 is formed on an area of the planarization layer 307, and contacts with an exposed area of either the source electrode 306a or the drain electrode 306b.

The pixel definition film 309, which has an opening for exposing at least one area of the first electrode 308, is formed on the first electrode 308 and the planarization layer 307. The light emitting layer 310 is formed on the opening of the pixel definition film 309, and the second electrode 311 is formed on the light emitting layer 310 and the pixel definition film 309.

The contact frame 130 has transmission portions 133 that allow the laser to pass through the transmission portions 133 and a magnetic substance. In one embodiment, the magnetic substance includes a ferromagnetic substance and/or an anti-ferromagnetic substance and is made of one among Fe, Ni, Cr, $Fe_2O_3$, $Fe_3O_4$, $CoFe_2O_4$, and/or a combination thereof. FIG. 5 is a cross-sectional view taken along the line A-A' of FIG. 2 showing a construction of the transmission portions 133. Because of the transmission portions 133, the contact frame 130 functions as a mask to radiate the laser only on a portion (e.g., a predetermined portion) of the donor film 200. Though a material of the transmission portions 133 is not limited, the material of the transmission portions 133 may be a glass or a transparent polymer in one exemplary embodiment. Also, because the transmission portions 133 do not include any magnet, the area of the transmission portions 133 is limited to 1% through 50% of a total area of the contract frame 130 in one embodiment, such that the magnetic force of the contact frame 130 is maintained at a suitable level or an optimum level to laminate the donor film and the accepter substrate.

The contact frame 130 can be exchanged with other contact frames having transmission (or transmitting) portions to form sub-pixels of an organic light emitting device. Similarly, the donor film 200 can be exchanged with other donor films having different color emission layers, for example, to form different color sub-pixels.

According to a laser induced thermal imaging apparatus and a laser induced thermal imaging method, and an organic light emitting display device using the same of the present invention, the donor substrate and the accepter substrate is laminated using a magnetic force under a vacuum state, such that the vacuum state is maintained as the prior process of the organic light emitting device. Furthermore, the present invention has an effect that by laminating the donor substrate and the accepter substrate without creating impurities or a space, the light emitting layer transfer of the organic light emitting diode is effectively performed.

Although certain exemplary embodiments of the present invention have been shown and described, it would be appreciated by those skilled in the art that changes might be made to the described embodiments without departing from the principles and spirit of the invention, the scope of which is defined in the claims and their equivalents.

What is claimed is:

1. A laser induced thermal imaging apparatus for forming a light emitting layer of an organic light emitting display device, the laser induced thermal imaging apparatus comprising:
    a substrate stage adapted to receive an accepter substrate and a donor film to be laminated, the accepter substrate having a pixel area of the organic light emitting display device and a magnet, the donor film having the light emitting layer to be transferred to the pixel area;
    a laser oscillator for radiating a laser to the donor film;
    a contact frame adapted to be placed between the substrate stage and the laser oscillator, the contact frame having at least one transmission portion corresponding to the light emitting layer to be transferred to the accepter substrate and having a magnet for forming a magnetic force with the accepter substrate; and
    a contact frame transferring mechanism for moving the contact frame toward the substrate stage,
    wherein the magnet of the contact frame comprises an electromagnet.

2. The laser induced thermal imaging apparatus as claimed in claim 1, the apparatus further comprising a vacuum chamber in which at least the substrate stage and the contact frame are placed.

3. The laser induced thermal imaging apparatus as claimed in claim 1, wherein the contact frame comprises the magnet, or the magnet is located at an upper surface or a lower surface of the contact frame.

4. The laser induced thermal imaging apparatus as claimed in claim 1, wherein the magnet of the acceptor substrate is formed at an upper surface or a lower surface of the accepter substrate.

5. The laser induced thermal imaging apparatus as claimed in claim 1, wherein the magnet of the accepter substrate is an electromagnet or a permanent magnet.

6. The laser induced thermal imaging apparatus as claimed in claim 1, wherein the at least one transmission portion comprises a pattern of openings.

7. The laser induced thermal imaging apparatus as claimed in claim 1, wherein the at least one transmission portion comprises transparent material adapted to allow the laser to pass through.

8. The laser induced thermal imaging apparatus as claimed in claim 7, wherein the transparent material comprises a glass or a transparent polymer.

9. The laser induced thermal imaging apparatus as claimed in claim 1, wherein a total area of the at least one transmission portion of the contact frame is 1% to 50% of an area of the contact frame.

10. The laser induced thermal imaging apparatus as claimed in claim 1, wherein the magnet of the accepter substrate comprises a magnetic substance.

11. The laser induced thermal imaging apparatus as claimed in claim 10, wherein the magnetic substance is one selected from the group consisting of Fe, Ni, Cr, $Fe_2O_3$, $Fe_3O_4$, $CoFe_2O_4$, and any combination thereof.

12. The laser induced thermal imaging apparatus as claimed in claim 1, wherein the magnet of the contact frame comprises a magnetic substance.

13. The laser induced thermal imaging apparatus as claimed in claim 12, wherein the magnetic substance is one selected from the group consisting of Fe, Ni, Cr, $Fe_2O_3$, $Fe_3O_4$, $CoFe_2O_4$, and any combination thereof.

14. A laser induced thermal imaging method for forming a light emitting layer of an organic light emitting display device, the method comprising:
    laminating a donor film and an accepter substrate between a contact frame having a magnet and a substrate stage, the donor film comprising a light emitting layer, the accepter substrate having a pixel area of the organic light emitting display device and a magnet, the light emitting layer being adapted to be transferred to the pixel area;
    adhering the accepter substrate and the donor film using a magnetic force formed between the accepter substrate and the contact frame; and
    radiating a laser on the donor film to allow the light emitting layer of the donor film to be transferred to the accepter substrate.

15. The laser induced thermal imaging method as claimed in claim 14, the method further comprising separating the contact frame from the accepter substrate.

* * * * *